United States Patent
Miyoshi

(10) Patent No.: US 7,595,113 B2
(45) Date of Patent: Sep. 29, 2009

(54) LED DEVICES AND SILICONE RESIN COMPOSITION THEREFOR

(75) Inventor: Kei Miyoshi, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 187 days.

(21) Appl. No.: 11/137,358

(22) Filed: May 26, 2005

(65) Prior Publication Data

US 2005/0212008 A1 Sep. 29, 2005

Related U.S. Application Data

(63) Continuation-in-part of application No. 10/721,277, filed on Nov. 26, 2003, now abandoned.

(30) Foreign Application Priority Data

Nov. 29, 2002 (JP) ............................. 2002-347603
Nov. 28, 2003 (EP) ................................ 03257536

(51) Int. Cl.
   *C08G 77/08* (2006.01)
(52) U.S. Cl. ........................... 428/447; 528/15; 528/43; 528/31
(58) Field of Classification Search ................ 428/447; 528/15, 43, 31
   See application file for complete search history.

(56) References Cited

U.S. PATENT DOCUMENTS

| | | | |
|---|---|---|---|
| 3,723,567 A | 3/1973 | Mink et al. | |
| 3,944,519 A | 3/1976 | Mink et al. | |
| 3,996,195 A * | 12/1976 | Sato et al. | 528/31 |
| 4,239,867 A | 12/1980 | Legrow et al. | |
| 4,340,710 A * | 7/1982 | Brown, Jr. | 528/15 |
| 5,739,199 A * | 4/1998 | Eguchi et al. | 524/493 |
| 5,998,925 A | 12/1999 | Shimizu et al. | |
| 6,039,831 A * | 3/2000 | Mine et al. | 156/272.6 |
| 6,069,440 A | 5/2000 | Shimizu et al. | |
| 6,204,523 B1 * | 3/2001 | Carey et al. | 257/98 |
| 6,285,513 B1 | 9/2001 | Tsuji et al. | |
| 6,297,305 B1 * | 10/2001 | Nakata et al. | 524/313 |
| 6,608,332 B2 | 8/2003 | Shimizu et al. | |
| 6,614,179 B1 | 9/2003 | Shimizu et al. | |
| 7,153,914 B2 * | 12/2006 | Staiger et al. | 525/478 |
| 7,160,972 B2 * | 1/2007 | Young et al. | 528/31 |
| 2003/0141510 A1 | 7/2003 | Brunner et al. | |

FOREIGN PATENT DOCUMENTS

| | | |
|---|---|---|
| JP | 10-228249 A | 8/1998 |
| JP | 10-242513 A | 9/1998 |
| JP | 11-1619 A | 1/1999 |
| JP | 2000-123981 A | 4/2000 |
| WO | WO-01/82385 A1 | 11/2001 |

* cited by examiner

*Primary Examiner*—Margaret G Moore
(74) *Attorney, Agent, or Firm*—Birch, Stewart, Kolasch & Birch, LLP

(57) ABSTRACT

LED devices encapsulated with silicone resin compositions comprising (A) a silicone resin having at least two alkenyl groups bonded to silicon atoms in a molecule, (B) an organohydrogensilane and/or organohydrogenpolysiloxane having at least two hydrogen atoms bonded to silicon atoms in a molecule, and (C) an addition reaction catalyst which cure into transparent products having heat resistance and discoloration resistance.

7 Claims, 2 Drawing Sheets

US 7,595,113 B2

LED DEVICES AND SILICONE RESIN COMPOSITION THEREFOR

CROSS-REFERENCE TO RELATED APPLICATION

This application is a continuation-in-part of application Ser. No. 10/721,277 filed on Nov. 26, 2003, the entire contents of which are hereby incorporated by reference. Application Ser. No. 10/721,277 is now abandoned.

BACKGROUND OF THE INVENTION

1. Field of the Invention

This invention relates to silicone resin compositions for light-emitting diode (LED) devices, and more particularly to silicone resin compositions for the protection, bonding, wavelength alteration or adjustment, and lens formation in LED devices. The invention also relates to LED devices encapsulated with a cured product of the silicon resin composition.

2. Background Art

In the prior art, epoxy resins are often used as the sealing material for LED devices. With respect to silicone resins, JP-A 10-228249 discloses the use as mounting members, JP-A 10-242513 corresponding to U.S. Pat. Nos. 5,998,925, 6,614,179, 6,069,440 and 6,608,332 discloses the use as lenses, and JP-A 2000-123981 attempts to use silicone resins as wavelength adjusting coatings. Few silicone resins are actually used in such applications.

While a great focus is being directed to white LED, new problems emerge like UV-induced yellowing of epoxy resin encapsulants during actual use, which has been negligible, and cracking of encapsulants by heat generation increased as a result of size reduction. It is urgently needed to overcome these problems.

SUMMARY OF THE INVENTION

An object of the invention is to provide a silicone resin composition for use with light-emitting diode (LED) devices, that cures into a product which is fully transparent and is little discolored over time. Another object of the invention is to provide an LED device encapsulated with the cured product of the silicone resin composition.

The present invention provides a silicone resin composition of the addition reaction curing type comprising as essential components (A) a silicone resin having at least two alkenyl groups bonded to silicon atoms in a molecule, (B) an organohydrogensilane and/or organohydrogenpolysiloxane having at least two hydrogen atoms bonded to silicon atoms in a molecule, and (C) an addition reaction catalyst.

One preferred embodiment of the invention is a silicone resin composition of the addition reaction curing type comprising as essential components, (A) 100 parts by weight of a liquid or solid organopolysiloxane represented by the average compositional formula (1):

$$R_n SiO_{(4-n)/2} \qquad (1)$$

wherein R is independently a substituted or unsubstituted monovalent hydrocarbon group, alkoxy group or hydroxyl group, 0.1 to 80 mol % of the entire R groups being alkenyl groups, and n is a positive number of $1 \leq n < 2$, and having a viscosity of at least 10 mPa·s at 25° C., (B) 2 to 100 parts by weight of an organohydrogenpolysiloxane having at least two SiH bonds in a molecule represented by the average compositional formula (2):

$$R'_a H_b SiO_{(4-a-b)/2} \qquad (2)$$

wherein R' is independently a substituted or unsubstituted monovalent hydrocarbon group excluding an aliphatic unsaturated hydrocarbon group, "a" is a positive number of 0.7 to 2.1, "b" is a positive number of 0.001 to 1.0, satisfying $0.8 \leq a+b \leq 2.6$, and having a viscosity of up to 1,000 mPa·s at 25° C. and/or an organohydrogensilane represented by the formula: $R'_c SiH_{(4-c)}$ wherein R' is as defined above and c is 1 or 2, and (C) a catalytic amount of an addition reaction catalyst.

This silicone resin composition cures into a transparent product having heat resistance and discoloration resistance and is best suited for use with LED devices.

Accordingly, the present invention provides a light-emitting diode (LED) device encapsulated with a cured product of the above silicone resin composition.

DESCRIPTION OF THE PREFERRED EMBODIMENTS

Figure 1:
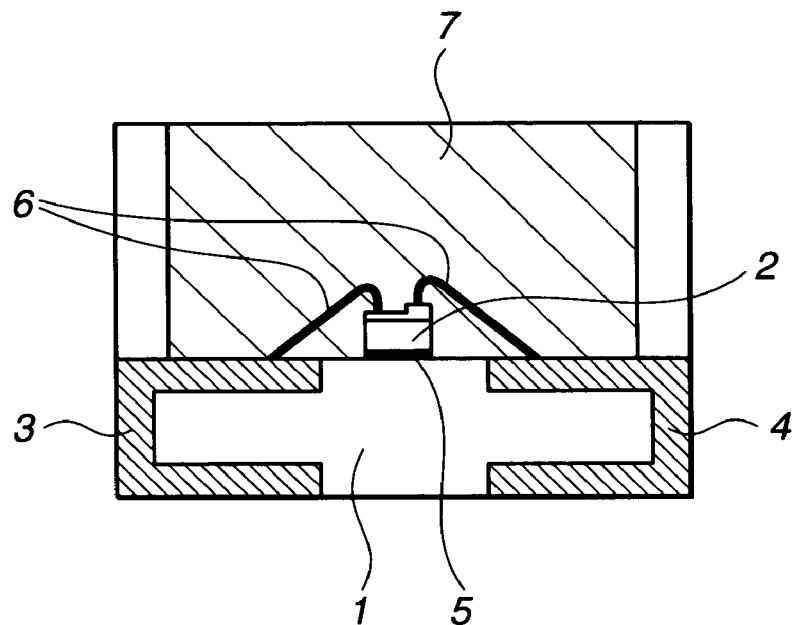
FIG. 1 is a schematic cross section of an exemplary surface mounting light-emitting semiconductor device in which a light-emitting member is die-bonded to an insulating housing.

The silicone resin composition for LED devices of the present invention includes as essential components, (A) a silicone resin having at least two alkenyl groups bonded to silicon atoms in a molecule, (B) an organohydrogensilane and/or organohydrogenpolysiloxane having at least two hydrogen atoms bonded to silicon atoms in a molecule, and (C) an addition reaction catalyst.

For actual in-line use, a silicone resin composition of the heat curing type is preferred because it can be cured within a brief time.

The silicone resin (A) is preferably a liquid or solid organopolysiloxane of branched or three-dimensional network structure having a viscosity of at least 10 mPa·s at 25° C., represented by the average compositional formula (1).

$$R_n SiO_{(4-n)/2} \qquad (1)$$

Herein R is independently a substituted or unsubstituted monovalent hydrocarbon group, alkoxy group or hydroxyl group, 0.1 to 80 mol % of the entire R groups being alkenyl groups, and n is a positive number of $1 \leq n < 2$, preferably $1 \leq n \leq 1.8$, more preferably $1 \leq n \leq 1.5$.

In formula (1), the silicon atom-bonded, substituted or unsubstituted, monovalent hydrocarbon groups represented by R are generally those of 1 to about 12 carbon atoms, preferably 1 to about 8 carbon atoms, for example, alkyl groups such as methyl, ethyl, propyl, isopropyl, butyl, isobutyl, tert-butyl, pentyl, neopentyl, hexyl, cyclohexyl, octyl, nonyl and decyl, aryl groups such as phenyl, tolyl, xylyl and naphthyl, aralkyl groups such as benzyl, phenylethyl, and phenylpropyl, alkenyl groups such as vinyl, allyl, propenyl, isopropenyl, butenyl, hexenyl, cyclohexenyl, and octenyl, substituted ones of the foregoing groups in which some or all of the hydrogen atoms are substituted with halogen atoms (e.g., fluoro, bromo, chloro), cyano groups or the like, such as halo-substituted alkyl groups like chloromethyl, chloropropyl, bromoethyl and trifluoropropyl, and cyanoethyl.

At least two of R groups must be alkenyl groups, preferably of 2 to 8 carbon atoms, more preferably 2 to 6 carbon atoms. The content of alkenyl groups is about 0.1 to 80 mol %, preferably about 0.5 to 50 mol %, more preferably about 1 to 30 mol % of the entire organic groups R (substituted or unsubstituted monovalent hydrocarbon groups).

Of the above-described silicone resins as component (A), a silicone resin having a high phenyl content is more preferred because the incorporation of phenyl groups in the resin is effective to provide a high refractive index. The more preferred silicone resin has the average compositional formula (1-1).

$$R_p(C_6H_5)_q SiO_{(4-p-q)/2} \quad (1\text{-}1)$$

Herein R is as defined above, and p and q are positive numbers satisfying $1 \leq p+q < 2$, preferably $1 \leq p+q \leq 1.8$, more preferably $1 \leq p+q \leq 1.5$, and $0.20 \leq q/(p+q) \leq 0.95$, preferably $0.30 \leq q/(p+q) \leq 0.80$, more preferably $0.45 \leq q/(p+q) \leq 0.70$. Reference is made to JP-A 11-1619.

The silicone resin used as the base polymer is preferably a liquid or solid organopolysiloxane having a viscosity at 25° C. of at least 10 mPa·s, more preferably at least 100 mPa·s, even more preferably at least 10,000 mPa·s. In component (A), a straight chain diorganopolysiloxane which contains alkenyl groups (e.g., vinyl) bonded to silicon atoms at ends of the molecular chain, silicon atoms midway the molecular chain, or silicon atoms at ends of and midway the molecular chain, whose backbone consists essentially of recurring diorganosiloxane units, which is capped with triorganosiloxy groups at both ends of the molecular chain, and which may or may not contain phenyl groups may be blended as an optional component for the purposes of adjusting the viscosity of the composition or the hardness of the cured product and so on.

Component (B) is an organohydrogensilane and/or an organohydrogenpolysiloxane, which serves as a crosslinking agent for causing the composition to cure, by inducing hydrosilylation reaction with the alkenyl group-containing silicone resin (A). Component (B) is desirably an organohydrogenpolysiloxane having at least two, especially at least three SiH bonds in a molecule represented by the average compositional formula (2):

$$R'_a H_b SiO_{(4-a-b)/2} \quad (2)$$

wherein R' is independently selected from substituted or unsubstituted monovalent hydrocarbon groups excluding aliphatic unsaturated hydrocarbon groups, "a" and "b" are positive numbers satisfying $0.7 \leq a \leq 2.1$, $0.001 \leq b \leq 1.0$, and $0.8 \leq a+b \leq 2.6$, preferably $0.8 \leq a \leq 2$, $0.01 \leq b \leq 1$, and $1 \leq a+b \leq 2.4$, and having a viscosity of up to 1,000 mPa·s at 25° C. and/or an organohydrogensilane represented by the formula: $R'_c SiH_{(4-c)}$ wherein R' is as defined above and c is equal to 1 or 2.

Examples of the monovalent hydrocarbon groups represented by R' are as exemplified for R in formula (1), with those free of aliphatic unsaturation being preferred.

Typical examples of the organohydrogensilane and organohydrogenpolysiloxane include $(CH_3)SiH_3$, $(CH_3)_2SiH_2$, $(C_6H_5)SiH_3$, 1,1,3,3-tetramethyldisiloxane, 1,3,5,7-tetramethylcyclotetrasiloxane, both end trimethylsiloxy-capped methylhydrogenpolysiloxane, both end trimethylsiloxy-capped dimethylsiloxane-methylhydrogensiloxane copolymers, both end dimethylhydrogensiloxy-capped dimethylpolysiloxane, both end dimethylhydrogensiloxy-capped dimethylsiloxane-methylhydrogensiloxane copolymers, both end trimethylsiloxy-capped methylhydrogensiloxane-diphenylsiloxane copolymers, both end trimethylsiloxy-capped methylhydrogensiloxane-diphenylsiloxane-dimethylsiloxane copolymers, copolymers consisting of $(CH_3)_2 HSiO_{1/2}$ units and $SiO_{4/2}$ units, and copolymers consisting of $(CH_3)_2 HSiO_{1/2}$ units, $SiO_{4/2}$ units and $(C_6H_5)SiO_{3/2}$ units.

The molecular structure of the organohydrogenpolysiloxane may be a straight, branched, cyclic or three-dimensional network structure. The number of silicon atoms per molecule, i.e., degree of polymerization is preferably in the range of about 3 to about 1,000, more preferably about 3 to about 300.

Preferably the organohydrogenpolysiloxane has a viscosity at 25° C. of up to 1,000 mPa·s, more preferably 0.1 to 500 mPa·s, even more preferably 0.5 to 300 mPa·s.

It is preferable that when the silicone resin (A) has a phenyl group, the organohydrogensilane and/or organohydrogenpolysiloxane as component (B) has a phenyl group as well because this ensures transparency and prevents separation during shelf storage. In this embodiment, it is preferable that at least 5 mol %, more preferably 8 to 50 mol %, even more preferably 10 to 30 mol % of the entire groups bonded to silicon atoms (R' and hydrogen atoms) in formula (2) be phenyl groups. Also preferably, component (B) is a mixture of an organohydrogenpolysiloxane of formula (2) wherein less than 15 mol %, especially 10 mol % to less than 15 mol % of the entire groups bonded to silicon atoms (R' and hydrogen atoms) are phenyl groups and an organohydrogenpolysiloxane of the compositional formula (2) wherein at least 15 mol %, especially 15 mol % to 50 mol % of the entire groups bonded to silicon atoms (R' and hydrogen atoms) are phenyl groups in a weight ratio between 1:9 and 9:1, especially 3:7 and 7:3.

An appropriate amount of the organohydrogensilane and/or organohydrogenpolysiloxane blended as component (B) is 2 to 100 parts by weight, preferably 10 to 100 parts by weight per 100 parts by weight of the silicone resin (A).

Also, the organohydrogensilane and/or organohydrogenpolysiloxane as component (B) is used in such amounts that the molar ratio of silicon atom-bonded hydrogen atoms (i.e., SiH groups) in component (B) to silicon atom-bonded alkenyl groups in the silicone resin or the silicone resin and the optional alkenyl group-containing straight chain diorganopolysiloxane combined as component (A) may fall in the range of 0.5 to 5 mol/mol, preferably 0.8 to 4 mol/mol, and more preferably 1 to 3 mol/mol.

Component (C) is an addition reaction catalyst for promoting the hydrosilylating addition reaction between alkenyl groups in component (A) and SiH groups in component (B). Typical addition reaction catalysts are platinum group metal catalysts including platinum catalysts such as platinum black, platinum chloride, chloroplatinic acid, the reaction products of chloroplatinic acid with monohydric alcohols, complexes of chloroplatinic acid with olefins, and platinum bisacetoacetate, palladium catalysts, and rhodium catalysts. The addition reaction catalyst may be used in a catalytic amount, preferably in such an amount to give about 1 to 500 ppm, especially about 2 to 100 ppm of platinum group metal based on the weight of components (A) and (B) combined.

In addition to components (A) to (C) described above, the inventive composition may further comprise optional components insofar as the objects of the invention are not compromised. Suitable optional components include addition reaction inhibitors for adjusting cure and imparting a pot life, and hardness or viscosity-adjusting agents, for example, non-reactive straight chain organopolysiloxanes and straight chain or cyclic low-molecular-weight organopolysiloxanes having about 2 to about 10 silicon atoms as well as the above-described alkenyl group-containing straight chain diorganopolysiloxane which may or may not contain a phenyl group, such as dimethylpolysiloxane.

Insofar as transparency is not impaired, there may be blended inorganic fillers such as fumed silica for enhancing strength. If desired, wavelength adjusting agents, dyes, pigments, flame retardants, heat resistance improvers and anti-degradants may also be blended.

The composition may be cured under any desired conditions although it is preferably cured by heating at about 120 to 180° C. for about 30 to 180 minutes.

The silicone resin compositions of the invention are used with LED devices for the purposes of protection, encapsulation, bonding, wavelength alteration or adjustment, and lens formation of LED devices and afford transparent cured products having heat resistance and discoloration resistance.

The inventive LED devices are those encapsulated with the above-described silicone resin composition.

Figure 2:
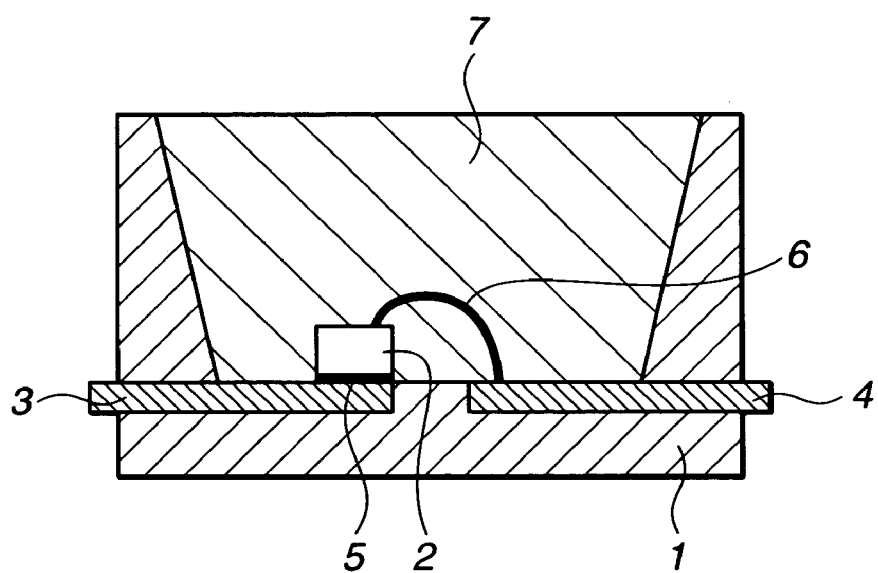
FIG. 2 is a schematic cross section of another exemplary surface mounting light-emitting semiconductor device in which a light-emitting member is die-bonded to lead electrodes inserted through a housing.
Figure 3:
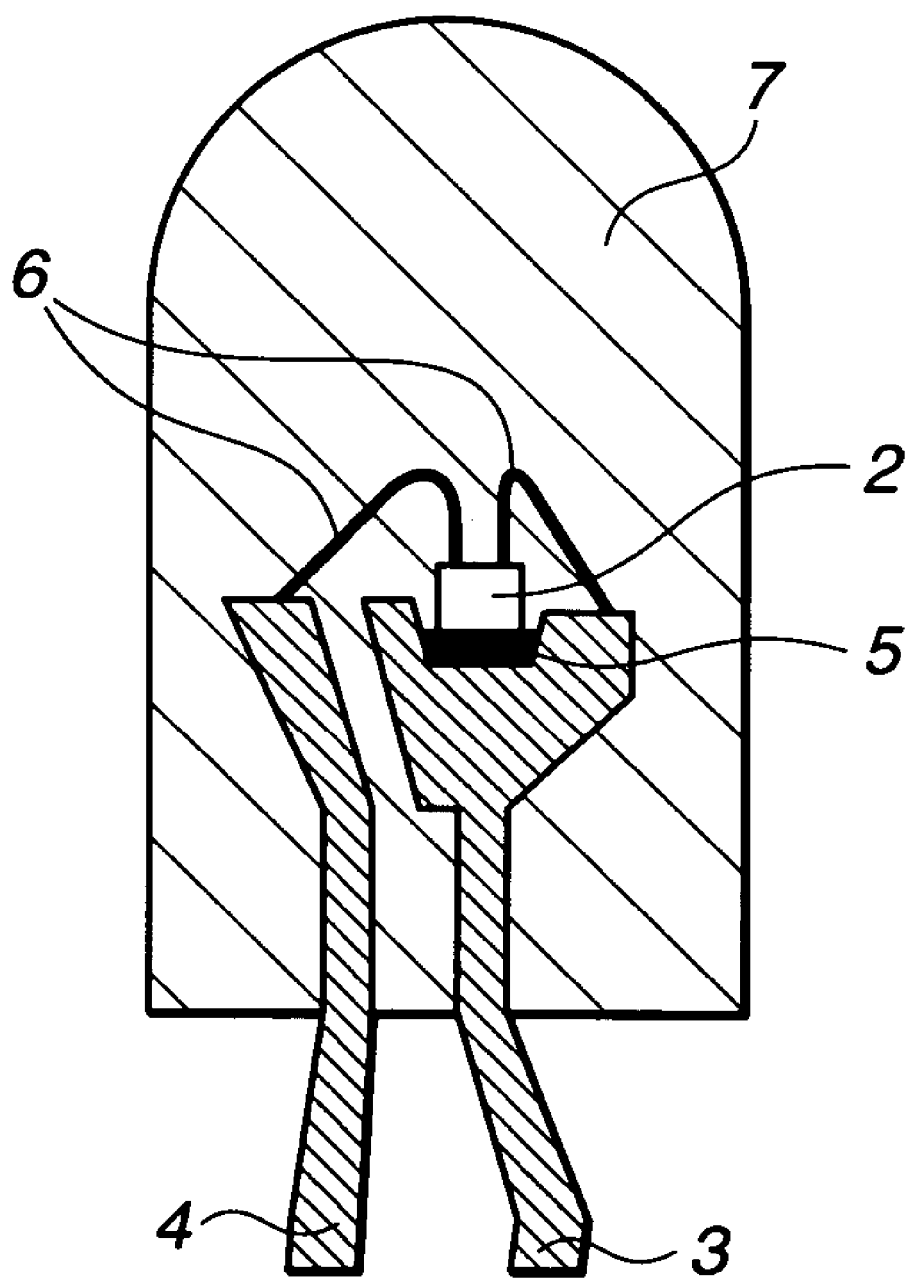
FIG. 3 is a schematic cross section of an LED as a lamp type light-emitting semiconductor device.

Traditional light-emitting semiconductor devices such as light-emitting diodes (LED) are lamp-type light-emitting semiconductor devices in which a light-emitting semiconductor member is disposed on a lead electrode and encapsulated with a transparent resin to a cannonball shape as shown in FIG. 3. They are recently replaced by the "surface mount" type as a result of simplification of the mounting technology. Nowadays surface mounting light-emitting semiconductor devices as shown in FIGS. 1 and 2 become the mainstream.

In FIGS. 1 to 3, the device includes a housing 1 of glass fiber-reinforced epoxy resin, a light-emitting semiconductor member 2, lead electrodes 3 and 4, a die-bonding material 5, gold wires 6, and an encapsulant or potting composition 7.

While resin compositions are used for the embedment of light-emitting semiconductor members such as LED, it is required that the cured resin compositions be transparent.

The use of the inventive silicone resin composition as an encapsulator can impart a cured product which is fully transparent, has a high heat resistance and is little discolored over time when encapsulating LED devices.

It is not critical how to embed light-emitting semiconductor members. In a typical procedure, as shown in FIGS. 1 and 2, a light-emitting semiconductor member 2 is disposed in an open interior of a housing 1, the interior is filled with the silicone resin composition 7 so as to surround the light-emitting semiconductor member 2, and the composition is cured.

EXAMPLE

Examples of the invention are given below by way of illustration and not by way of limitation.

Example 1

A reactor was charged with toluene, ethyl polysilicate, vinyldimethylchlorosilane, and trimethylchlorosilane. Co-hydrolytic polymerization was effected, yielding a 50 wt % toluene solution of an organopolysiloxane resin copolymer (silicone resin) consisting of $CH_2=CH(CH_3)_2SiO_{1/2}$ units, $(CH_3)_3SiO_{1/2}$ units and $SiO_2$ units, and having a ratio of $[(CH_3)_3SiO_{1/2}$ units$+CH_2=CH(CH_3)_2SiO_{1/2}$ units$]/SiO_2$ units equal to 0.85 mol/mol and a vinyl group content of 0.02 mol/100 g. This was combined with an equal amount calculated as solids of a vinyl end-capped dimethylpolysiloxane having a viscosity of 500 mPa·s at 23° C. The mixture was vacuum stripped at 150° C. until the depletion of strippable matter, yielding a liquid material having a viscosity of 30,000 mPa·s. To 100 parts by weight of this silicone resin as the base were added an amount of a platinum catalyst to give 20 ppm platinum element and 0.5 part by weight of tetravinyltetramethyltetracyclosiloxane as a reaction inhibitor. To 100 parts by weight of this mixture was added 6 parts by weight of methylhydrogensiloxane capable of generating 350 ml/g of hydrogen gas and having a viscosity of 20 mPa·s at 23° C. as a curing agent. They were mixed and deaerated, after which the composition was cast into a glass plate-assembled mold to a thickness of 3 mm where it was cured at 120° C. for one hour.

Example 2

A reactor was charged with toluene, phenyltrichlorosilane, vinylmethyldichlorosilane, and dimethyldichlorosilane. Co-hydrolytic polymerization was effected, yielding a 50 wt % toluene solution of an organopolysiloxane resin copolymer (silicone resin) consisting of $(C_6H_5)SiO_{3/2}$ units, $(CH_2=CH)(CH_3)SiO_{2/2}$ units and $(CH_3)_2SiO_{2/2}$ units, and having an average compositional formula: $(CH_3)_{0.65}(C_6H_5)_{0.55}(CH_2=CH)_{0.25}SiO_{1.28}$. To 100 parts by weight of this silicone resin dissolved was added 10 parts by weight of a phenylmethylhydrogensiloxane containing 20 mol % of phenyl groups based on the total of silicon atom-bonded methyl groups, phenyl groups and hydrogen atoms (SiH groups), capable of generating 150 ml/g of hydrogen gas and having a viscosity of 10 mPa·s. After mixing, the mixture was vacuum stripped at 150° C. until the depletion of strippable matter. The mixture was cooled to room temperature, after which 0.2 part by weight of ethynyl cyclohexanol as a reaction inhibitor was added. To the mixture was added an amount of a platinum catalyst to give 20 ppm platinum element. They were mixed by agitation and deaerated, after which the composition was cast into a mold as in Example 1 where it was cured at 120° C. for 30 minutes. The cured product was taken out of the mold and post-cured in a drier at 180° C. for 2 hours, obtaining a sample.

Example 3

A reactor was charged with toluene, phenyltrichlorosilane, vinylmethyldichlorosilane, and dimethyldichlorosilane. Co-hydrolytic polymerization was effected, yielding a 50 wt % toluene solution of an organopolysiloxane resin copolymer (silicone resin) consisting of $(C_6H_5)SiO_{3/2}$ units, $(CH_2=CH)(CH_3)SiO_{2/2}$ units and $(CH_3)_2SiO_{2/2}$ units, and having an average compositional formula: $(CH_3)_{0.65}(C_6H_5)_{0.55}(CH_2=CH)_{0.25}SiO_{1.28}$. To 100 parts by weight of this silicone resin dissolved were added 20 parts by weight of a phenylmethylhydrogensiloxane containing 20 mol % of phenyl groups based on the total of silicon atom-bonded methyl groups, phenyl groups and hydrogen atoms (SiH groups), capable of generating 150 ml/g of hydrogen gas and having a viscosity of 10 mPa·s and 10 parts by weight of a phenylmethylhydrogensiloxane containing 10 mol % of phenyl groups based on the total of silicon atom-bonded methyl groups, phenyl groups and hydrogen atoms (SiH groups), capable of generating 120 ml/g of hydrogen gas and having a viscosity of 20 mPa·s. After mixing, the mixture was vacuum stripped at 150° C. until the depletion of strippable matter. The mixture was cooled to room temperature, after which 0.2 part by weight of ethynyl cyclohexanol as a reaction inhibitor was added. To the mixture was added an amount of a platinum catalyst to give 20 ppm platinum element. They were mixed by agitation and deaerated, after which the composition was cast into a mold as in Example 1 where it was cured at 120° C. for 30 minutes. The cured product was taken out of the mold and post-cured in a drier at 180° C. for 2 hours, obtaining a sample.

Comparative Example

A commercially available transparent epoxy resin material commonly used with lamp type LEDs was cast into a mold as in Example 1 and cured at 150° C. for 8 hours, obtaining a sample.

Physical properties of the samples of Examples and Comparative Example are shown in Table 1.

TABLE 1

| Properties | Example 1 | Example 2 | Example 3 | Comparative Example |
|---|---|---|---|---|
| Refractive index of base | 1.41 | 1.51 | 1.51 | 1.51 |
| Hardness (Shore D) | | 75 | 74 | 85 |
| Hardness (Shore A) | 77 | | | |
| Flexural strength* (MPa) | | 100 | 95 | 135 |
| Tensile strength** (MPa) | 5.4 | | | |

*JIS K 6911
*JIS K 6249

The samples of Examples and Comparative Example were examined for light transmittance by the following tests.

A sample as prepared was measured for light transmittance at 400 nm, obtaining an initial value. The sample was exposed to ultraviolet radiation in a sunshine weatherometer (Suga Tester Co., Ltd.) for 100 hours and 500 hours, after which light transmittance was measured again. The results are shown in Table 2.

TABLE 2

| Light transmittance | Example 1 | Example 2 | Example 3 | Comparative Example |
|---|---|---|---|---|
| Initial | 95 | 95 | 94 | 97 |
| After 100 hour exposure | 91 | 93 | 92 | 81 |
| After 500 hour exposure | 92 | 91 | 90 | 65 |

Separately, a sample as prepared was held in a drier at 120° C. for 100 hours and 500 hours, after which light transmittance was measured again. The results are shown in Table 3.

TABLE 3

| Light transmittance | Example 1 | Example 2 | Example 3 | Comparative Example |
|---|---|---|---|---|
| Initial | 95 | 95 | 94 | 97 |
| After 100 hour heating | 92 | 90 | 92 | 78 |
| After 500 hour heating | 92 | 88 | 90 | 65 |

Japanese Patent Application No. 2002-347603 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A light-emitting diode device encapsulated with a cured product of a silicone resin composition comprising:
   (A) 100 parts by weight of a liquid or solid organopolysiloxane of branched or three-dimensional network structure represented by the average compositional formula (1-1):

$$R_p(C_6H_5)_q SiO_{(4-p-q)/2} \quad (1\text{-}1)$$

wherein R is independently an unsubstituted monovalent hydrocarbon group, alkoxy group or hydroxyl group, 0.1 to 80 mol % of the entire R groups being alkenyl groups, and p and q are positive numbers satisfying $1 \leq p+q < 2$ and $0.20 \leq q/(p+q) \leq 0.95$, and having a viscosity of at least 100 mPa·s at 25° C.;
   (B) 2 to 100 parts by weight of an organohydrogenpolysiloxane having at least two SiH bonds in a molecule represented by the average compositional formula (2)

$$R'_a H_b SiO_{(4-a-b)/2} \quad (2)$$

wherein R' is independently an unsubstituted monovalent hydrocarbon group excluding an aliphatic unsaturated hydrocarbon group, and at least 5 mol % of the entire R' and H being phenyl groups, "a" is a positive number of 0.7 to 2.1, "b" is a positive number of 0.001 to 1.0, satisfying $0.8 \leq a+b \leq 2.6$, and having a viscosity of up to 1,000 mPa·s at 25° C., wherein component (B) is a mixture, in a weight ratio between 1:9 and 9:1, of an organohydrogenpolysiloxane of the compositional formula (2) wherein phenyl groups comprise at least 5 mol % to less than 15 mol % of the entire R' and H and an organohydrogenpolysiloxane of the compositional formula (2) wherein phenyl groups comprise at least 15 mol % to 50 mol % of the entire R' and H; and
   (C) a catalytic amount of an addition reaction catalyst.

2. The device of claim 1, wherein the composition is heat curable.

3. The device of claim 1, wherein components (A), (B), and (C) of the composition are selected such that a cured sample of the composition has a light transmittance of at least 90% after exposure to light for 500 hours.

4. The device of claim 1, wherein component (B) is an organohydrogenpolysiloxane having a straight structure.

5. The light-emitting diode device of claim 1, wherein the mixture of an organohydrogenpolysiloxane of the compositional formula (2) wherein phenyl groups comprise at least 10 mol % to less than 15 mol % of the entire R' and H and an organohydrogenpolysiloxane of the compositional formula (2) wherein phenyl groups comprise at least 15 mol % to 50 mol % of the entire R' and H is in a weight ratio between 3:7 to 7:3.

6. A light-emitting diode device encapsulated with a cured product of a silicone resin composition consisting of:
   (A) 100 parts by weight of a liquid or solid organopolysiloxane of branched or three-dimensional network structure represented by the average compositional formula (1-1):

$$R_p(C_6H_5)_q SiO_{(4-p-q)/2} \quad (1\text{-}1)$$

wherein R is independently an unsubstituted monovalent hydrocarbon group, alkoxy group or hydroxyl group, 0.1 to 80 mol % of the entire R groups being alkenyl groups, and p and q are positive numbers satisfying $1 \leq p+q < 2$ and $0.20 \leq q/(p+q) \leq 0.95$, and having a viscosity of at least 100 mPa·s at 25° C.;

(B) 2 to 100 parts by weight of an organohydrogenpolysiloxane having at least two SiH bonds in a molecule represented by the average compositional formula (2)

$$R'_a H_b SiO_{(4-a-b)/2} \quad (2)$$

wherein R' is independently an unsubstituted monovalent hydrocarbon group excluding an aliphatic unsaturated hydrocarbon group, and at least 5 mol % of the entire R' and H being phenyl groups, "a" is a positive number of 0.7 to 2.1, "b" is a positive number of 0.001 to 1.0, satisfying $0.8 \leq a+b \leq 2.6$, and having a viscosity of up to 1,000 mPa·s at 25° C. wherein component (B) is a mixture, in a weight ratio between 1:9 and 9:1, of an organohydrogenpolysiloxane of the compositional formula (2) wherein phenyl groups comprise at least 5 mol % to less than 15 mol % of the entire R' and H and an organohydrogenpolysiloxane of the compositional formula (2) wherein phenyl groups comprise at least 15 mol % to 50 mol % of the entire R' and H;

(C) a catalytic amount of an addition reaction catalyst; and at least one component selected from the group consisting of addition reaction inhibitors, hardness or viscosity-adjusting agents, inorganic fillers, wavelength adjusting agents, dyes, pigments, flame retardants, heat resistance improvers, and antidegradants.

7. The light-emitting diode device of claim 6, wherein the mixture of an organohydrogenpolysiloxane of the compositional formula (2) wherein phenyl groups comprise at least 10 mol % to less than 15 mol % of the entire R' and H and an organohydrogenpolysiloxane of the compositional formula (2) wherein phenyl groups comprise at least 15 mol % to 50 mol % of the entire R' and H is in a weight ratio between 3:7 to 7:3.

* * * * *